(12) United States Patent
Satoh

(10) Patent No.: US 8,227,773 B2
(45) Date of Patent: Jul. 24, 2012

(54) VERSATILE BEAM GLITCH DETECTION SYSTEM

(75) Inventor: Shu Satoh, Byfield, MA (US)

(73) Assignee: Axcelis Technologies, Inc., Beverly, MA (US)

(*) Notice: Subject to any disclaimer, the term of this patent is extended or adjusted under 35 U.S.C. 154(b) by 208 days.

(21) Appl. No.: 12/846,313

(22) Filed: Jul. 29, 2010

(65) Prior Publication Data

US 2012/0025107 A1 Feb. 2, 2012

(51) Int. Cl.
- *H01J 37/317* (2006.01)
- *H01J 37/256* (2006.01)
- *G21K 5/10* (2006.01)

(52) U.S. Cl. ............. 250/492.21; 250/492.2; 250/492.3; 250/396 R; 250/397; 427/523

(58) Field of Classification Search ............. 250/492.21, 250/492.2, 492.3, 396 R, 397; 427/523
See application file for complete search history.

(56) References Cited

U.S. PATENT DOCUMENTS

| | | | |
|---|---|---|---|
| 5,554,857 A | 9/1996 | Benveniste | |
| 5,736,743 A | 4/1998 | Benveniste | |
| 6,639,227 B1 | 10/2003 | Glavish et al. | |
| 7,161,161 B2* | 1/2007 | Renau et al. | 250/492.21 |
| 7,166,854 B2* | 1/2007 | Renau et al. | 250/492.21 |
| 7,304,319 B2 | 12/2007 | Kawaguchi et al. | |
| 7,351,987 B2 | 4/2008 | Kabasawa et al. | |
| 7,589,333 B2* | 9/2009 | Graf et al. | 250/492.21 |
| 7,800,083 B2 | 9/2010 | Vanderberg et al. | |
| 8,071,964 B2* | 12/2011 | Satoh | 250/492.21 |

OTHER PUBLICATIONS

Notice of Allowance Dated Oct. 28, 2011 for U.S. Appl. No. 12/477,631.
Non-Final Office Action Dated May 4, 2011 for U.S. Appl. No. 12/477,631. 15 Pages.
U.S. Appl. No. 12/477,631, filed Jun. 3, 2009.

* cited by examiner

*Primary Examiner* — Nikita Wells
(74) *Attorney, Agent, or Firm* — Eschweiler & Associates, LLC

(57) ABSTRACT

A glitch duration threshold is determined based on an allowable dose uniformity, a number of passes of a workpiece through an ion beam, a translation velocity, and a beam size. A beam dropout checking routine repeatedly measures beam current during implantation. A beam dropout counter is reset each time beam current is sufficient. On a first observation of beam dropout, a counter is incremented and a position of the workpiece is recorded. On each succeeding measurement, the counter is incremented if beam dropout continues, or reset if beam is sufficient. Thus, the counter indicates a length of each dropout in a unit associated with the measurement interval. The implant routine stops only when the counter exceeds the glitch duration threshold and a repair routine is performed, comprising recalculating the glitch duration threshold based on one fewer translations of the workpiece through the beam, and performing the implant routine starting at the stored position.

19 Claims, 6 Drawing Sheets

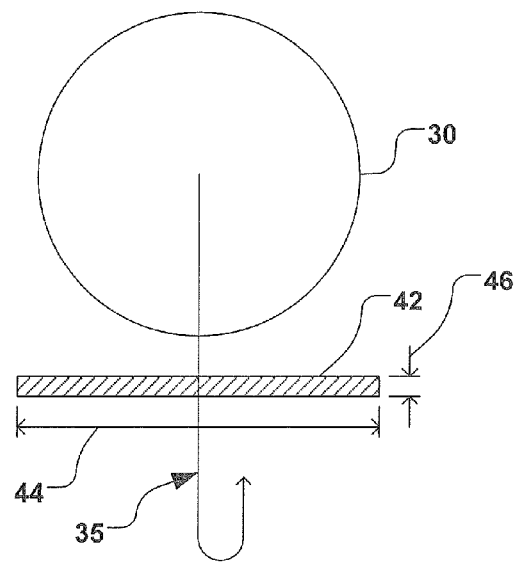
FIG. 2
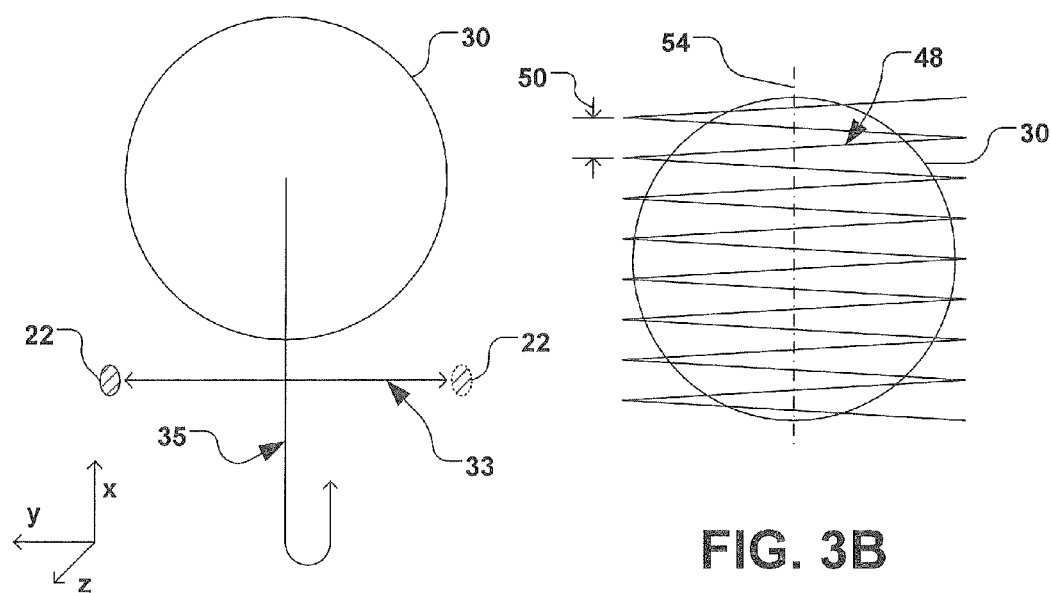
FIG. 3A
FIG. 3B

VERSATILE BEAM GLITCH DETECTION SYSTEM

FIELD OF THE INVENTION

The present invention relates generally to ion implantation systems and methods, and more particularly, to a method for addressing ion beam discrepancies during ion implantation.

BACKGROUND OF THE INVENTION

Ion implantation systems are used to impart impurities, known as dopant elements, into workpieces such as semiconductor substrates or wafers. In a typical ion implantation system, an ion source ionizes a desired dopant element, and the ionized impurity is extracted from the ion source as a beam of ions. The ion beam is directed (e.g., swept or scanned) across respective workpieces to implant ionized dopants within the workpieces. The dopant ions thus alter the composition of the workpieces, causing them to possess desired electrical characteristics, such a may be useful for fashioning particular semiconductor devices, such as transistors, upon the substrates.

The continuing trend toward smaller electronic devices has driven the need to form a greater number of smaller, more powerful, and more energy efficient semiconductor devices onto individual workpieces. Thus, careful control over semiconductor fabrication processes such as ion implantation, and more particularly, the uniformity of ions implanted into the workpieces, is necessitated. Moreover, semiconductor devices are being fabricated upon larger workpieces to increase product yield. For example, wafers having a diameter of 300 mm or more are being utilized so that more devices can be produced on a single wafer. Such wafers are expensive and as such, it is highly desirable to mitigate waste, such as having to scrap an entire wafer due to non-uniform ion implantation. However, larger wafers and high density features can make uniform ion implantation challenging, since the ion beam is scanned across greater angles and distances in order to reach the perimeters of the wafers, yet not miss implanting any region therebetween.

In addition, the high voltage typically necessary to supply the ion source is subject to occasional arcing between various extraction and suppression electrodes and other components associated therewith. This tendency for arcing often fully discharges one or more affected high voltage power supplies until the arc naturally self-extinguishes at a much lower supply voltage. While arcing, the beam current may become erratic or interrupted until the supply voltage is restored, during which time ion implantation may experience intermittent ion implantation. Such an arcing and subsequent intermittent ion implantation is commonly referred to as a "glitch". During serial wafer processing, when a glitch along a path of the ion beam is detected, conventionally, the region or portion of the beam path that failed to be implanted during the glitch is specifically "repaired" by various techniques of re-tracing the path with ion beam in order to "fill in" the non-implanted region. Such repairs are time consuming and sometimes lead to further undesirable effects caused by the starting and stopping of the ion beam in the glitch region, especially when very short glitches occur. Accordingly, there is a need for a dynamic determination of the appropriate action to be taken when a glitch or non-uniformity in the ion beam is detected.

SUMMARY OF THE INVENTION

The present invention overcomes the limitations of the prior art and provides an inventive method for addressing discrepancies in an ion beam during ion implantation into a workpiece. Accordingly, the following presents a simplified summary of the invention in order to provide a basic understanding of some aspects of the invention. This summary is not an extensive overview of the invention. It is intended to neither identify key or critical elements of the invention nor delineate the scope of the invention. Its purpose is to present some concepts of the invention in a simplified form as a prelude to the more detailed description that is presented later.

In accordance with the invention, a method for addressing a discrepancy in current or voltage of an ion beam (also called a "glitch") during an implantation of ions into a workpiece is provided. The method, for example, comprises providing an ion beam, such as spot or pencil beam, wherein one or more of the ion beam and workpiece are scanned with respect to one another in a first direction (e.g., along a first scan path or first axis, also referred to as a "fast scan" axis, path, or direction) and a second direction (e.g., along a second scan path or second axis, also referred to as a "slow scan" axis, path, or direction). The ion beam, for example, may alternatively comprise a ribbon beam. In one example, the workpiece is mechanically scanned in the second direction (e.g., along the second axis) through an ion beam that is electrostatically scanned in the first direction, wherein the second direction (e.g., the direction of travel of the workpiece) is generally perpendicular to the first direction (e.g., the direction of scanning of the ion beam).

In accordance with one aspect, a duration for which a glitch in the ion beam is to be disregarded is initially established, therein defining an ion beam glitch duration threshold. The ion beam glitch duration threshold, for example, is based, at least in part, on one or more of a desired final dose uniformity on the workpiece, a number of passes or translations of the workpiece through the ion beam, a velocity of the translation of the workpiece through the ion beam, and a size of the ion beam. The size of the ion beam, for example, is determined based on one or more of direct measurement and a knowledge of beam size based on predetermined system inputs.

During implantation of ions into the workpiece, one or more properties, such as a current of the ion beam, are iteratively measured concurrent with the translation of the workpiece through the ion beam. In one example, a counter is reset (e.g., set to zero) whenever the current of the ion beam is greater than a predetermined anomaly current, such as about 10% of normal operational implantation current. A position of the workpiece is stored when the measured current of the ion beam is initially less than the predetermined ion beam anomaly current, therein defining an onset of a glitch. For example, the position of the workpiece in the second direction is stored when the counter is zero and the determined current of the ion beam is less than the predetermined anomaly current. The counter, for example, is incremented for each subsequent iteration that the current of the ion beam is continuously determined to be less than the predetermined ion beam anomaly current.

In accordance with the invention, the ion implantation is halted only when the measured current of the ion beam is lower than the predetermined ion beam anomaly current for an amount of time that is greater than the predetermined glitch duration threshold (e.g., the period of time in which the glitch occurs exceeds the predetermined glitch duration threshold). For example, if the counter exceeds the ion beam glitch duration threshold, the ion beam is suppressed and the ion implantation is halted. The portion of the ion implantation associated with the glitch, for example, is subsequently repaired by repositioning the workpiece at the stored position, restarting the ion beam, and again translating the workpiece through the ion beam, therein implanting the portion of the workpiece associated with the glitch.

To the accomplishment of the foregoing and related ends, the invention comprises the features hereinafter fully described and particularly pointed out in the claims. The following description and the annexed drawings set forth in detail certain illustrative embodiments of the invention. These embodiments are indicative, however, of a few of the various ways in which the principles of the invention may be employed. Other objects, advantages and novel features of the invention will become apparent from the following detailed description of the invention when considered in conjunction with the drawings.

BRIEF DESCRIPTION OF THE DRAWINGS

FIG. 2 illustrates a broad beam or ribbon ion beam implant scheme according to an exemplary aspect.

FIGS. 3A-3B illustrate a scanned or hybrid implant scheme according to another exemplary aspect.

DETAILED DESCRIPTION OF THE INVENTION

Figure 1:
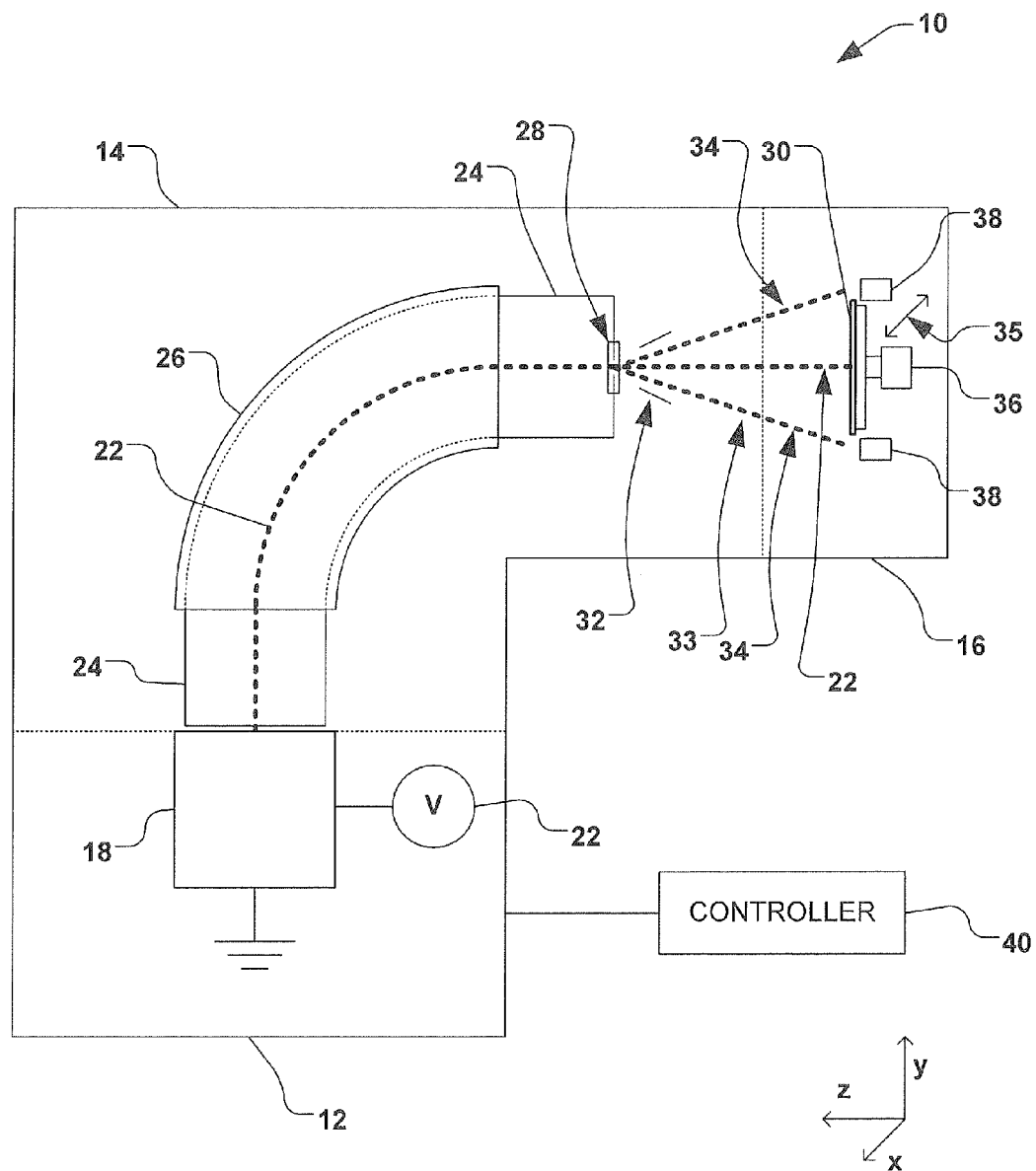
FIG. 1 illustrates a simplified ion implantation system in block diagram form, in accordance with one exemplary aspect of the invention.

The present invention is directed generally toward ion implantation systems and a method for addressing an intermittent ion beam, wherein a determination regarding an appropriate repair operation is made in-situ. Accordingly, the present invention will now be described with reference to the drawings, wherein like reference numerals may be used to refer to like elements throughout. It should be understood that the description of these aspects are merely illustrative and that they should not be interpreted in a limiting sense. In the following description, for purposes of explanation, numerous specific details are set forth in order to provide a thorough understanding of the present invention. It will be evident to one skilled in the art, however, that the present invention may be practiced without these specific details.

In the implantation of ions into a workpiece, such as a semiconductor wafer or substrate, it is common to encounter temporary arcing between various components upstream of the workpiece, wherein a temporary loss of ion beam power or beam current occurs. In conventional serial ion implanters, such a loss of ion beam power or current, also called a "glitch", typically lead to repairs being made to the workpiece being processed. Such repairs, however, have the potential to cause more significant problems on the workpiece, and furthermore, take valuable processing time to perform. Heretofore, no determinations have been conventionally made as to the necessity of the repair, as most all such glitches were considered to be cause for repair. The present invention advantageously uses a quality threshold, such as one provided by a customer or by statistical data, to determine whether a repair to a glitch should be performed.

FIG. 1 illustrates an exemplary ion implantation system 10 having a terminal 12, a beamline assembly 14, and an end station 16. The terminal 12, for example, comprises an ion source 18 powered by a high voltage power supply 20, wherein the ion source produces and directs an ion beam 22 through the beamline assembly 14, and ultimately, to the end station 16. The ion beam 22, for example, can take the form of a spot beam, pencil beam, ribbon beam, or any other shaped beam. The beamline assembly 14 further has a beamguide 24 and a mass analyzer 26, wherein a dipole magnetic field is established to pass only ions of appropriate charge-to-mass ratio through an aperture 28 at an exit end of the beamguide 24 to a workpiece 30 (e.g., a semiconductor wafer, display panel, etc.) positioned in the end station 16.

In accordance with one example, an ion beam scanning mechanism 32, such as an electrostatic or electromagnetic scanner, is configured to scan the ion beam 22 in at least a first direction 33 (e.g., the +/− y-direction, also called a first scan path or "fast scan" axis, path, or direction) with respect to the workpiece 30, therein defining a scanned ion beam 34. Furthermore, in the present example, a workpiece scanning mechanism 36 is provided, wherein the workpiece scanning mechanism is configured to selectively scan the workpiece 30 through the ion beam 22 in at least a second direction 35 (e.g., the +/− x-direction, also called a second scan path or "slow scan" axis, path, or direction). The ion beam scanning system 32 and the workpiece scanning system 36, for example, can be instituted separately, or in conjunction with one another, in order to provide the desired scanning of the workpiece relative to the ion beam 22. For example, the ion beam 22 is held generally stationary (e.g., not electrostatically scanned by the ion beam scanning mechanism 32), and the workpiece scanning mechanism 36 is configured to scan the workpiece 30 with respect to the ion beam in both the first direction 33 and second direction 35, therein providing a two-dimensional mechanical scan of the workpiece relative to the ion beam. In another example, the ion beam 22 is electrostatically scanned in the first direction 33, therein producing the scanned ion beam 34, and the workpiece 30 is mechanically scanned in the second direction 35 through the scanned ion beam 34. Such a combination of electrostatic and mechanical scanning of the ion beam 22 and workpiece 30 produces what is called a "hybrid scan". The present invention is applicable to all combinations of scanning of the workpiece 30 relative to the ion beam 22, or vice versa.

According to another example, one or more sensors 38, such as one or more Faraday cups, are further provided along the path of the ion beam 22 in order to measure one or more properties (e.g., ion beam current) of the ion beam. The one or more sensors 38 can be provided upstream or downstream of the workpiece 30, wherein the one or more sensors are configured to sense the one or more properties of the ion beam 22 when the ion beam does not intersect the workpiece. The one or more sensors 38, in another example, are associated with the power supply 20, wherein a current or voltage associated with the power supply is determined. A controller 40 is further provided, wherein the controller is configured to control at least one or more of the ion source 18, high voltage power supply 20, beamguide 24, mass analyzer 26, ion beam scanning mechanism 32, workpiece scanning mechanism 36, and one or more sensors 38.

Due, at least in part, to high voltages utilized within various components of the ion implantation system 10, high voltage arcs or sparking can occur at unanticipated times. Such arcs or sparking quite often causes a loss of ion beam current, generally referred to as an ion beam "glitch", for a short duration of time. The duration of the ion beam glitch, for example, often ranges between tens of microseconds to tens of milliseconds, depending on one or more of the particular component causing the high voltage spark, the condition of the particular high voltage, the voltage load, and the current load. When an ion beam glitch occurs, the workpiece 30 does not receive the desired implant dosage from the ion beam 22 during the duration of the glitch, and, as a result, the ion beam glitch affects the final dose uniformity on the workpiece.

The workpiece 30 is generally much larger than a cross-sectional size of the ion beam 22. The present invention contemplates various schemes for providing a uniform dosage of ions across the entire surface of the workpiece 30. One scheme employs one-dimensional scanning of the workpiece 30 in the second direction 35 (e.g., the +/− x-direction) through the ion beam 22, wherein the ion beam comprises a broad ribbon beam 42, as illustrated in FIG. 2. In the one-dimensional scanning, the workpiece scanning mechanism 36 of FIG. 1 mechanically scans the workpiece through the generally-uniform ribbon beam, wherein a width 44 of the ribbon beam is wider than the workpiece, but a thickness 46 of the ribbon beam is substantially thinner than the width.

FIG. 3A illustrates a two-dimensional scanning scheme, wherein scanning of the workpiece 30 and ion beam 22 relative to one another in two directions is employed. For example, the two-dimensional scanning illustrated in FIG. 3A can be accomplished by the hybrid scan described above, wherein a "fast scan" of a pencil or spot ion beam 22 in the first direction 33 (e.g., the +/− y-direction) at a relatively fast frequency (e.g., approx. 1 KHz) generally defines the scanned ion beam 34 of FIG. 1, and a relatively slow mechanical scan (e.g., less than 1 Hz) of the workpiece 30 in the second direction 35 (e.g., generally orthogonal to the first direction 33 of the scanned ion beam) provides exposure of the entire workpiece to the spot ion beam. Such a hybrid scan of FIG. 3A, for example, generally defines a raster scan pattern 48 across the workpiece 30, as illustrated in FIG. 3B, wherein a scan pitch 50 (e.g., on the order of approx. 0.1 mm), or distance between two fast scan traces, is significantly smaller than the size of the spot ion beam 22 (e.g., greater than approx. 10 mm).

Figure 4:
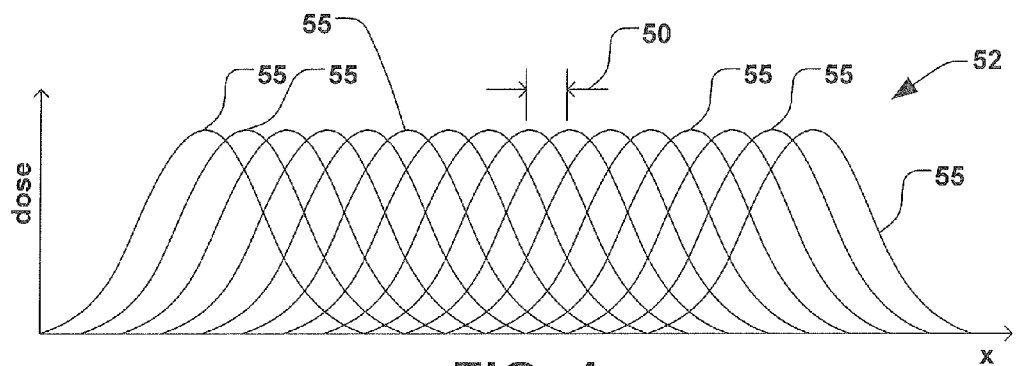
FIG. 4 illustrates a dose accumulation along a center line of a workpiece according to yet another exemplary aspect.

Referring now to FIG. 4, a dose accumulation or distribution 52 along the center line 54 of the workpiece 30 of FIG. 3B is illustrated, wherein the dose accumulation is generally associated with the amount of exposure the workpiece 30 is subjected to the ion beam 22 of FIG. 1. Due to the mechanical scanning of the workpiece 30 in the second direction 35 (e.g., the slow scan or x-direction) of FIG. 3A, for example, the ion beam center position shifts a small distance in the second direction (e.g., associated with the scan pitch 50 of FIG. 3B) for each scan of the ion beam 22 across the workpiece in the first direction 33. The resulting dose distribution 52 is a superposition of all beam profile passes 55, as illustrated in FIG. 4. In order to provide adequate dose uniformity, as well as to build up an adequate final dosage of ions on the workpiece 30 of FIG. 1, for example, the slow scan (e.g., the slow mechanical scan in the second direction 35) is repeated one or more times, typically with a minimum of two passes (e.g., a forward and backward pass along the x-axis) of the workpiece through the ion beam 22.

When an ion beam glitch (e.g., an anomaly in the ion beam 22) occurs, the effect of the glitch on final dose distribution is determined by several factors, including the total number of passes of the workpiece 30 relative to the ion beam. The inventors contemplate that if, for example, an implant comprises one hundred passes of the workpiece 30 in the second direction 35 through the scanned ion beam 34, and only one out of the total one hundred passes contains a glitch, the maximum effect of the glitch to the final dose is less than or equal to 1% for the entire workpiece, and this may be well within the acceptable level of uniformity of the implant.

Figure 5A:
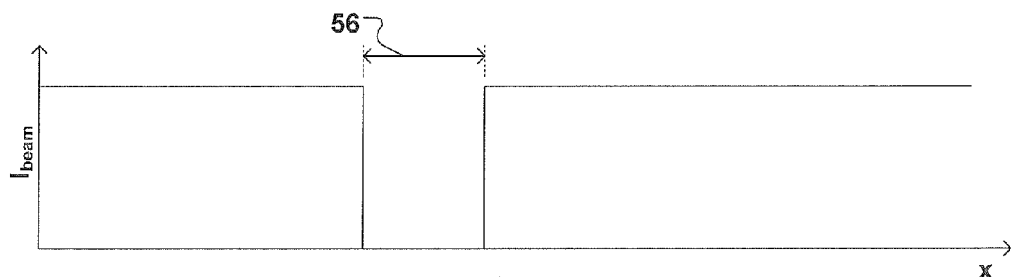
FIGS. 5A-5C illustrate an effect of a glitch on a workpiece according to still another exemplary aspect.
Figure 5B:
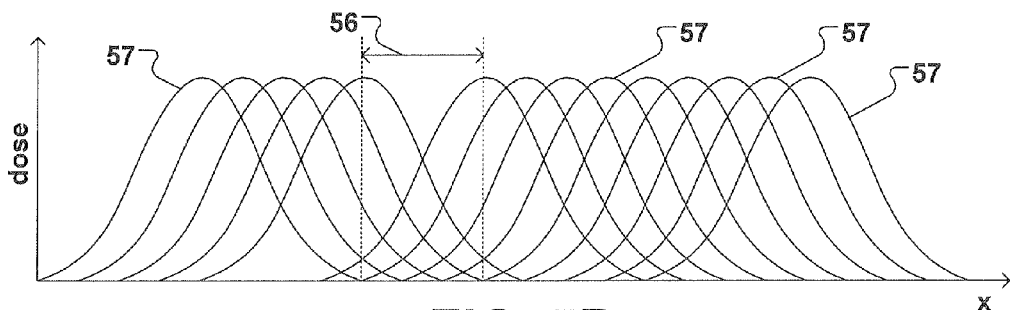

However, if the total number of passes in the second direction 35 for a particular implant is small, such as one complete forward and backward pass along the slow scan path, dose distribution from a glitch can become quite important. Dose distribution from a glitch, for example, is not a simple shape of ion beam dropout, but rather, is given as a superposition (or a convolution) of shifted ion beam profiles and beam dropout length, where beam dropout length is given by beam dropout time duration and slow scan velocity. FIG. 5A, for example, illustrates a scenario where a current of the ion beam drops out for a short period, identified as a glitch 56. FIG. 5B illustrates the superposition of beam profiles 57 similar to that of FIG. 4; however, several beam profiles are missing in FIG. 5B during the dropout during the glitch 56.

Figure 5C:
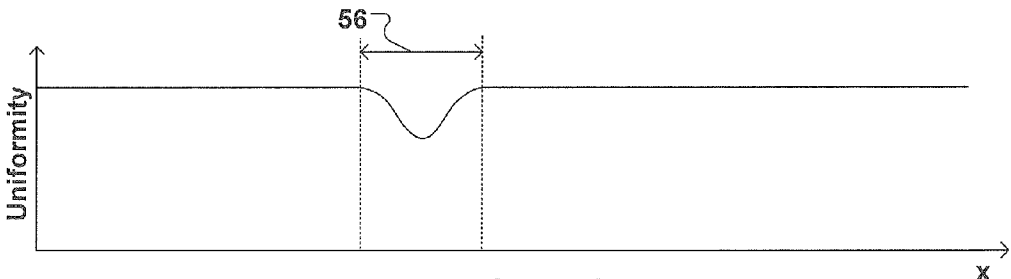
Figure 6A:
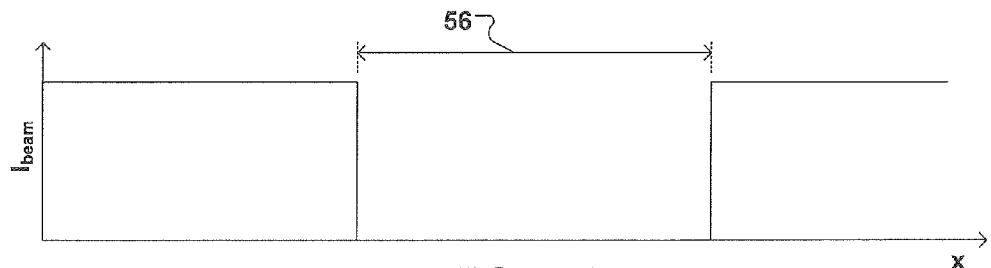
FIGS. 6A-6C illustrate another effect of another glitch on another workpiece according to a further exemplary aspect.
Figure 6B:
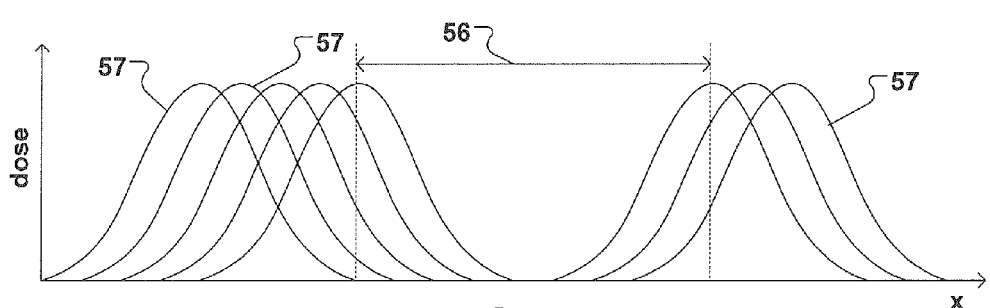
Figure 6C:
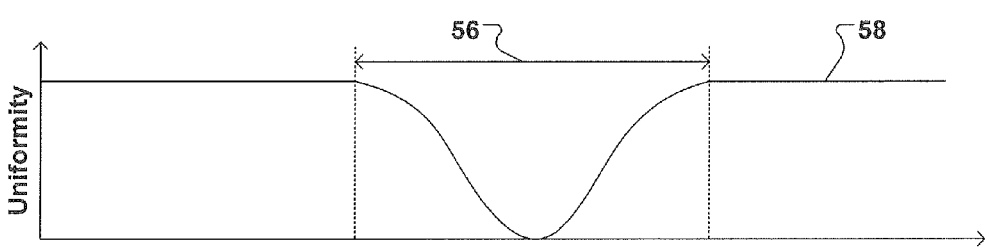

FIG. 5C illustrates, in general, a final dose distribution 58 as a superposition of the beam profiles 57 of FIG. 5B, showing the much milder total effect of the on the final dose distribution during the glitch 56 or beam dropout. The effect of a glitch to the dose distribution 58, i.e., the depth and width of the reduced dose, generally depends on three factors: the length of beam dropout (glitch duration), the beam size in the second direction 35 of FIG. 3A (e.g., the slow scan direction), and the speed of travel of the workpiece in the second direction (e.g., the slow scan speed). The present invention contemplates that even if a current of the ion beam 22 entirely drops to zero for a short duration, the resultant dose of the pass (e.g., as illustrated on FIG. 5C) will rarely see a complete disappearance of the final dose. On a short beam dropout (e.g., a short glitch duration) with wide beam size and relatively slow scan speed in the second direction 35 of FIG. 3A, for example, the effect is minimal. However, as evidenced in FIGS. 6A-6C, for example, a long beam dropout (e.g., a relatively long glitch duration) with a narrow beam size and relatively fast scan speed in the second direction 35 of FIG. 3A, the overall final dose may reach to zero in portions of the workpiece, as shown in FIG. 6C.

Figure 7:
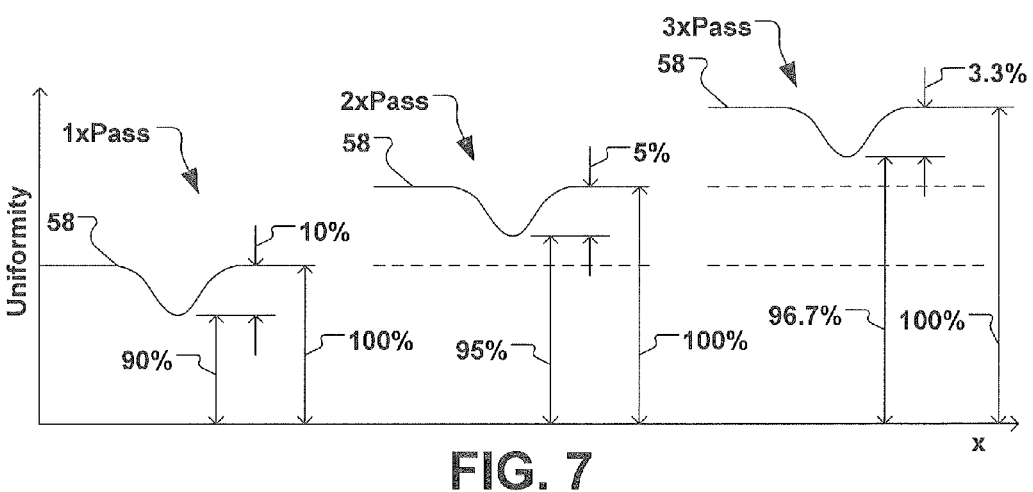
FIG. 7 illustrates a dilution of the effect of a glitch on numerous passes according to another aspect.

The effect of a glitch on the dose distribution 58 is diluted, however, if there are more passes without any glitches, as illustrated in FIG. 7. On a particular implant, good estimates are provided on the total number of passes in the second scan direction 35 of FIG. 3A, the scan velocities in the first direction 33 and second direction, as well as the size and shape of the ion beam 22. Therefore, the degree of dose uniformity deterioration by a glitch can be well estimated according to duration of the glitch, in accordance with the present invention.

Figure 8:
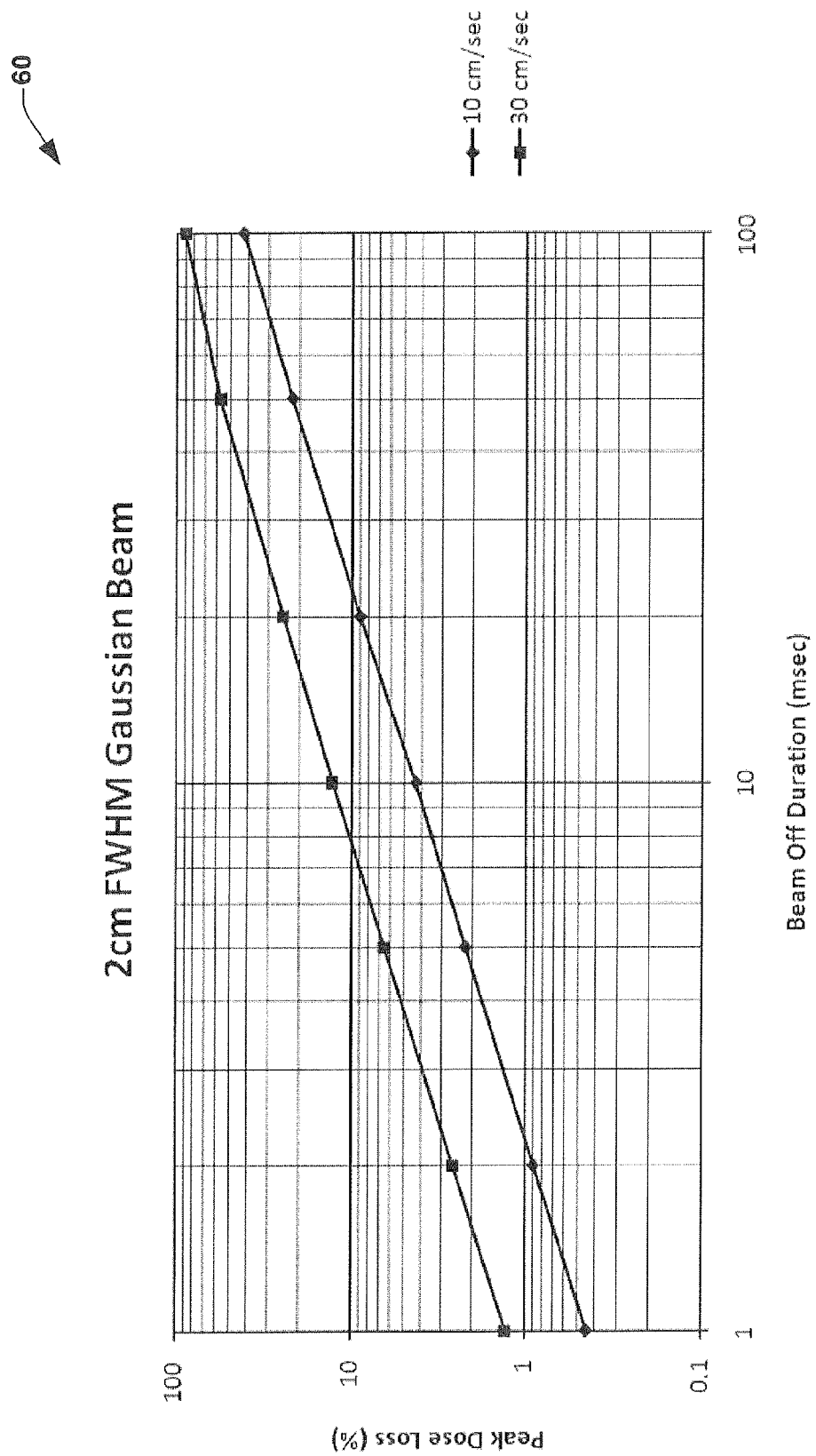
FIG. 8 is a graph illustrating a depth of missing dose according to a glitch duration according to still another aspect.

FIG. 8 is an exemplary graph 60 further illustrating an example of the depth of missing implant dosage during a glitch according to glitch duration at two differing scan velocities for a single scan pass in the second direction 35 of FIG. 3A. For an implant having two or more passes in the second direction 35, the total uniformity deterioration is obtained by dividing by the total number of passes in the second direction. The graph 60 of FIG. 8 illustrates, for example, that a glitch should be shorter than 5 msec if the maximum acceptable missing dose is 2% for a single-pass implant at a velocity in the second direction of 10 cm/sec. Otherwise, a glitch longer than 5 msec, under the same criteria, will result in a dosage uniformity (e.g., dose distribution 58 of FIG. 6C) that is unacceptable. For a two-pass implant, as will be understood from the graph 60 of FIG. 8, the glitch duration can be up to 10 msec, since the effect of the glitch is "diluted", or roughly halved, by the additional pass. For example, according to the graph 60, a glitch duration of 10 msec in a single pass implant will result in an approximately 4% non-uniformity. Providing a second pass roughly halves the non-uniformity to approximately 2% in a manner similar to that shown in FIG. 7.

On most conventional serial processing ion implanters, whenever a glitch is recorded, the position of the slow scan at the onset of the glitch is recorded, and the beam dropout is artificially elongated to a fixed length or to the end of the slow scan (i.e., the beam is intentionally suppressed), so that the missing part can be later filled with precision (also called "repainting"). Typically, this repainting has been done whenever a glitch is recorded, regardless of whether the glitch has a short or long duration. Repainting is a commonly a special "non-routine" process to fill-in a gap created by a particular glitch. Typically, this non-routine process deleteriously consumes extra time in processing, especially when there are many short glitches.

As highlighted above, however, the present invention appreciates that damage done by a glitch is generally dependent on factors such as the duration of a glitch, as well as a number of total scans, scan velocity, size of the ion beam, and other factors. The total number of passes of the workpiece through the ion beam, scan velocity and beam size/shape are generally known for a particular implant. The present invention thus establishes a glitch duration threshold for which a glitch can generally be disregarded, as will be further discussed infra. For example, if an experienced glitch duration is longer than the glitch duration threshold, in accordance with the present invention, damage to uniformity would be determined to be too large to be ignored, and the repaint process would be initiated. Alternatively, if the experienced glitch duration is shorter than the glitch duration threshold, the resultant damage to uniformity would be considered to be acceptable in accordance with the present invention, and repair or repainting of the workpiece is not performed, thus saving valuable processing time over conventional methods. The present invention thus provides a method for determining how to proceed when a glitch occurs during implantation of ions into the workpiece.

EXAMPLE 1

Acceptable maximum dosage dip is 2% on a two-pass implant having a 10 cm/sec slow scan speed, and the ion beam size is estimated to be 2 cm FWHM Gaussian. In this case, according to the graph 60 of FIG. 8, a dose dip of 4% from the pass is acceptable, since it is two pass implant, and any glitches longer than 10 msec would need to be repainted.

EXAMPLE 2

Acceptable maximum dosage dip is 2% on a ten-pass implant having a 10 cm/sec slow scan speed with 2 cm FWHM Gaussian beam. Since this is a ten-pass implant, a single glitch to cause up to a 20% dip in a single pass is allowed. From the graph 60, the maximum glitch duration is approximately 50 msec. That is, for this particular implant, a glitch up to 50 msec is permitted without repainting in order to meet the uniformity requirement. However, since most glitches commonly experienced are shorter than 50 msec, repainting will most likely not be required at all for such an implant.

In order to determine if repair or repainting of the workpiece is necessary, in accordance with the present invention, a determination is made as to whether the glitch is longer than a predetermined glitch duration threshold, wherein the predetermined glitch duration threshold is calculated from uniformity requirement for the implant, the total number of passes through the ion beam, a scan velocity and a size of the ion beam. Since the duration of a glitch cannot be predicted at the onset of the glitch, however, a position of the workpiece in the second direction (e.g., along the mechanical scan in the slow scan direction 35) at the onset of the glitch is recorded when the glitch is detected.

The scanning of the workpiece is continued, however, wherein the presence of an adequate ion beam is checked at short intervals (e.g., per millisecond). Only when the ion beam fails to recover adequately within the predetermined duration, however, is the glitch treated as a required-repair glitch, and a decision is made as to whether to perform a repair procedure, wherein the area of the workpiece that experienced the glitch is "repainted" or implanted again. The repair procedure artificially elongates the absence of the ion beam (also called suppression of automatic beam comeback) to a predetermined position (e.g., the end of the pass or scan in the second or slow-scan direction 35).

In accordance with the present invention, when the ion beam adequately recovers within the predetermined glitch duration threshold, however, the effect of the glitch to dose uniformity is ignored and no special actions are taken. Furthermore, according to another example, a "glitch budget" is introduced in the present disclosure. For example, an implant with many passes in the second direction 35, such as ten or more passes in the second direction, has a larger glitch budget than an implant having five or fewer passes in the second direction, as the implant with a greater number of passes is more tolerant to a small number of glitches. However, each glitch experienced for a given workpiece, even if the glitch duration is too short to warrant a repaint by itself, considering the dilution by the rest of "glitch free" implant, subtracts a certain amount from the overall glitch budget, and the implant becomes less tolerant to glitches after each subsequently encountered glitch. For example, an experience of an additional glitch after several previous glitches have already been ignored can cause the glitch budget to reach a point where any further glitches will necessitate a repair or repainting of the workpiece. It should be noted that the present invention is applicable to both broad-beam (ribbon) type and hybrid scanned implants of FIG. 2 and FIGS. 3A-3B, respectively.

Figure 9:
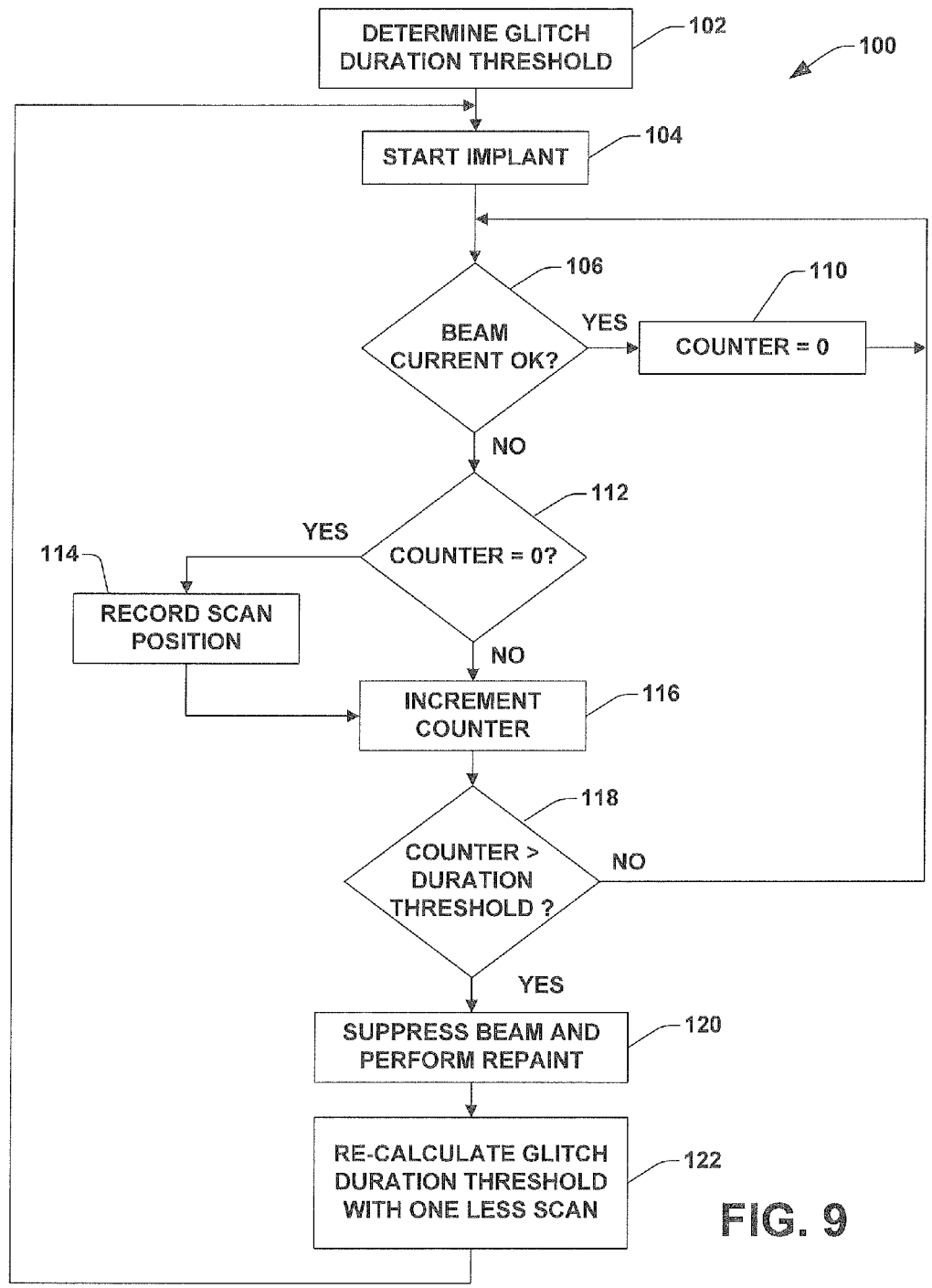
FIG. 9 illustrates a method for implanting ions into a workpiece and addressing a potential ion beam glitch in accordance with an exemplary aspect of the present invention.

Therefore, in accordance with another aspect of the present disclosure, FIG. 9 illustrates an exemplary method 100 for addressing a discrepancy during an implantation of ions into a workpiece. It should be noted that while exemplary methods are illustrated and described herein as a series of acts or events, it will be appreciated that the present invention is not limited by the illustrated ordering of such acts or events, as some steps may occur in different orders and/or concurrently with other steps apart from that shown and described herein, in accordance with the invention. In addition, not all illustrated steps may be required to implement a methodology in accordance with the present invention. Moreover, it will be appreciated that the methods may be implemented in association with the systems illustrated and described herein as well as in association with other systems not illustrated.

The method 100 of FIG. 9 begins at act 102, wherein an ion beam glitch duration threshold is determined. The determination of the ion beam glitch duration threshold is based, at least in part, on one or more of a desired final dose uniformity final implant dose uniformity on the workpiece, a number of translations or passes of the workpiece through the ion beam, a velocity of the translation, and a size of the ion beam. The size of the ion beam, for example, is determined based on one or more of a direct measurement, a knowledge of beam size based on predetermined system inputs, and an estimate of beam size based on a Gaussian distribution of previous ion beam sizes and known system inputs.

In act 104, an implant routine is performed, wherein ions are implanted into a workpiece. The implant routine, for example, comprises translating the workpiece through an ion beam. The ion beam, for example, comprises the scanned ion beam 34 of FIG. 1, wherein the ion beam 22 is scanned along a fast scan axis (e.g., the first direction 33). The workpiece is thus translated through the ion beam along the slow scan axis (e.g., the second direction), therein implanting ions into the workpiece. A current of the ion beam is determined (e.g., measured) and a determination is made in act 106 as to whether the current is greater than a predetermined value (also called an ion beam anomaly current) for adequate or satisfactory implantation. For example, a current of the ion beam above a predetermined noise level (e.g., 10% of normal operating current) is satisfactory for implanting ions into the workpiece. If the determination made in act 106 is such that there is sufficient ion beam current, a counter is set to zero in act 110, and the workpiece is concurrently implanted with ions. The determination of ion beam current in act 106, for example, comprises determining the current of the ion beam via a Faraday cup when the ion beam does not intersect the workpiece. In an alternative example, the determination of the ion beam current in act 106 comprises measuring one or more properties associated with a source of the ion beam, such as a high voltage power supply.

If the beam current is not adequate (e.g., the ion beam current is lower than the predetermined noise level, such as less than 10% of normal operating current), a determination is made in act 112 as to whether the counter is zero. If the counter is determined to be zero in act 112, a glitch is determined to have been initially encountered, and a position of the workpiece in the second direction is stored in act 114. The counter is then incremented in act 116. If the determination in act 112 indicates that the counter is non-zero (e.g., a glitch is already occurring), the counter is compared to the glitch duration threshold in act 118. If the counter is less than the glitch duration threshold, then the implant routine continues, and the ion beam current is checked again in act 106.

In accordance with one example of the present disclosure, acts 106 through 118 are performed in a predetermined time interval (e.g., 1 millisecond intervals), such that act 106 is repeated at each predetermined time interval. As such, the counter is either set to zero in act 110 or incremented in act 116, and act 106 is performed again at each predetermined time interval (e.g., 1 millisecond). Accordingly, in the present example, the timing of the duration of a glitch encountered during implantation is thus associated with the incrementation of the counter.

If the determination in act 118 is such that the counter is greater than the glitch duration threshold, then the implant routine is halted, and a repair or repaint routine is performed in act 120. The repair routine, in one example, comprises recalculating the ion beam glitch duration threshold in act 122, wherein the recalculation is based, at least in part, on one fewer translations of the workpiece through the ion beam. The workpiece, for example, is returned to the position in the second direction that was previously stored in act 114, wherein the implant routine is again performed starting with providing the ion beam again in act 104.

In accordance with the present example, if the determination in act 118 is such that the counter is less than the glitch duration threshold, but the ion beam current resumes to an acceptable level prior to again performing act 106, the counter is reset to zero in act 110, and the implantation started in act 104 continues. As such, the glitch is generally ignored. Thus, process efficiencies can be realized by the present invention, wherein time, material, and other savings can be evidenced by selectively ignoring and/or repairing glitches based on the aforementioned methodology, as opposed to performing traditional repairs every time a glitch is encountered, as is done conventionally.

Although the invention has been shown and described with respect to a certain preferred embodiment or embodiments, it is obvious that equivalent alterations and modifications will occur to others skilled in the art upon the reading and understanding of this specification and the annexed drawings. In particular regard to the various functions performed by the above described components (assemblies, devices, circuits, etc.), the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more other features of the other embodiments as may be desired and advantageous for any given or particular application.

What is claimed is:

1. A method for addressing a glitch during an implantation of ions into a workpiece, the method comprising:
    providing an ion beam;
    determining an ion beam glitch duration threshold, wherein the ion beam glitch duration threshold is based, at least in part, on one or more of a number of translations of the workpiece through an ion beam, a velocity of the translation, and a size of the ion beam;
    translating the workpiece through the ion beam along at least a slow scan path, therein implanting ions into the workpiece;
    iteratively determining a current of the ion beam at a plurality of predetermined intervals during the translation of the workpiece;
    setting a counter to zero when the determined current of the ion beam is greater than a predetermined value;
    storing a position of the workpiece when the counter is zero and the determined current of the ion beam is less than the predetermined value, therein defining an onset of a glitch;
    incrementing the counter for each iteration that the determined current of the ion beam is less than the predetermined value and the position of the workpiece is stored;
    suppressing the ion beam if the counter exceeds the ion beam glitch duration threshold; and
    repositioning the workpiece at the stored position, restarting the ion beam, and again translating the workpiece through the ion beam along at least the slow scan path, therein implanting a portion of the workpiece associated with the glitch.

2. The method of claim 1, further comprising recalculating the ion beam glitch duration threshold after suppressing the ion beam, wherein the recalculation is based, at least in part, on one fewer translations of the workpiece through the ion beam along the slow scan path.

3. The method of claim 2, further comprising halting the ion implantation when the ion beam glitch duration is less than the predetermined minimum.

4. The method of claim 1, wherein predetermined value of the current of the ion beam is approximately 10% of a normal operational ion implantation current.

5. The method of claim 1, wherein providing the ion beam comprises scanning a pencil beam along a fast scan path, wherein the fast scan path is generally perpendicular to the slow scan path.

6. The method of claim 1, wherein iteratively determining the current of the ion beam comprises measuring the current of the ion beam when the ion beam does not intersect the workpiece along a fast scan path.

7. The method of claim 5, wherein determining the current of the ion beam comprises measuring the current of the ion beam via a Faraday cup.

8. The method of claim 1, wherein determining the current of the ion beam comprises measuring one or more properties associated with a source of the ion beam.

9. A method for addressing an ion implantation anomaly, the method comprising:
providing a predetermined glitch duration threshold;
providing an ion beam;
translating a workpiece through the ion beam;
iteratively measuring a current of the ion beam concurrent with the translation;
storing a position of the workpiece when the measured current of the ion beam is less than a predetermined ion beam anomaly current, therein defining an onset of a glitch; and
halting the ion implantation and repairing the ion implantation associated with the glitch only when the measured current of the ion beam is lower than the predetermined ion beam anomaly current for a time greater than the predetermined glitch duration threshold.

10. The method of claim 9, further comprising repositioning the workpiece after the ion implantation is halted, wherein the workpiece is at the stored position when the repair of the ion implantation is started.

11. The method of claim 9, wherein translating the workpiece through the ion beam comprises reciprocating the workpiece along a fast scan path and translating the workpiece along a slow scan path, wherein the slow scan path is generally perpendicular to the fast scan path.

12. The method of claim 11, wherein iteratively measuring the current of the ion beam comprises measuring the current at an inflection position associated with a reversal of direction of the workpiece along the fast scan path.

13. The method of claim 9, wherein translating the workpiece through the ion beam comprises reciprocating the ion beam along a fast scan path and translating the workpiece along a slow scan path, wherein the slow scan path is generally perpendicular to the fast scan path.

14. The method of claim 13, wherein iteratively measuring the current of the ion beam comprises measuring the current at an inflection position associated with a reversal of direction of the ion beam along the fast scan path.

15. The method of claim 9, further comprising decreasing the predetermined glitch duration threshold by a predetermined amount each time the ion implantation is halted and repaired.

16. The method of claim 15, wherein the predetermined amount is associated with a time taken to translate the workpiece along a slow scan path during the ion implantation.

17. The method of claim 15, wherein the ion implantation is not repaired once the predetermined glitch duration threshold is less than a predetermined minimum.

18. The method of claim 9, wherein the predetermined ion beam anomaly current is approximately 10% of a normal operational ion implantation current.

19. The method of claim 9, wherein the predetermined glitch duration threshold is based, at least in part, on one or more of a number of translations of the workpiece along a slow scan path through the ion beam, a velocity of the translation along the slow scan path, and a size of the ion beam.

* * * * *